United States Patent
Lee et al.

(10) Patent No.: US 8,986,846 B2
(45) Date of Patent: Mar. 24, 2015

(54) THERMOSETTING OLIGOMER OR POLYMER, THERMOSETTING RESIN COMPOSITION INCLUDING THE OLIGOMER OR POLYMER, AND PRINTED CIRCUIT BOARD USING THE COMPOSITION

(75) Inventors: Jae Jun Lee, Suwon-si (KR); Mahn Jong Kim, Daejeon (KR); Kwang Hee Kim, Seoul (KR)

(73) Assignee: Samsung Electro-Mechanics Co., Ltd. (KR)

( * ) Notice: Subject to any disclaimer, the term of this patent is extended or adjusted under 35 U.S.C. 154(b) by 677 days.

(21) Appl. No.: 12/489,881

(22) Filed: Jun. 23, 2009

(65) Prior Publication Data

US 2010/0155120 A1 Jun. 24, 2010

(30) Foreign Application Priority Data

Dec. 23, 2008 (KR) .................. 10-2008-0132150

(51) Int. Cl.

| | |
|---|---|
| C08G 63/685 | (2006.01) |
| C08G 73/00 | (2006.01) |
| C08J 5/24 | (2006.01) |
| C08L 67/00 | (2006.01) |
| C08L 77/00 | (2006.01) |
| C08G 73/10 | (2006.01) |
| C08G 73/02 | (2006.01) |
| H05K 1/03 | (2006.01) |

(52) U.S. Cl.
CPC ............ *C08G 73/101* (2013.01); *C08G 63/685* (2013.01); *C08G 73/026* (2013.01); *C08J 5/24* (2013.01); *C08J 2377/12* (2013.01); *C08J 2379/08* (2013.01); *H05K 1/032* (2013.01)
USPC .................... 428/474.4; 428/423.1; 428/480; 428/44; 428/75; 428/86; 428/170; 428/176; 524/538; 524/539; 525/420; 525/421; 525/422; 525/426; 525/434; 525/437; 528/183; 528/190; 528/192; 528/193; 528/205; 528/206; 528/210; 528/212; 528/310; 528/322; 528/329.1; 528/330; 528/331; 528/332; 528/335

(58) Field of Classification Search
CPC .. C08G 63/685; C08G 73/026; C08G 73/101; C08J 5/24; C08J 2377/12; C08J 2379/08; C08J 2367/00
USPC ........... 428/423.1, 474.4, 480; 524/538, 539; 525/420, 421, 422, 426, 434, 437; 528/44, 75, 86, 170, 176, 183, 190, 528/192, 193, 205, 206, 210, 212, 310, 322, 528/329.1, 330, 331, 332, 335
See application file for complete search history.

(56) References Cited

U.S. PATENT DOCUMENTS

| | | | |
|---|---|---|---|
| 5,198,551 A | 3/1993 | Benicewicz et al. | |
| 2004/0082724 A1* | 4/2004 | Dershem et al. | 525/242 |
| 2005/0054756 A1* | 3/2005 | Kamayachi et al. | 524/115 |
| 2010/0051862 A1* | 3/2010 | Share et al. | 252/188.28 |

FOREIGN PATENT DOCUMENTS

| | | | |
|---|---|---|---|
| EP | 0890615 | * | 1/1999 |
| JP | 11-092647 | | 4/1999 |
| WO | 02/22706 A1 | | 3/2002 |

OTHER PUBLICATIONS

Ferrero et al, Synthesis and Characterization of Aromatic Polyamides Containing Alkylphthalimido Pendent Groups, Journal of Polymer Science: Part A: Polymer Chemistry, vol. 40, 3711-3724 (2002).*

* cited by examiner

*Primary Examiner* — Ana Woodward
(74) *Attorney, Agent, or Firm* — Cantor Colburn LLP

(57) ABSTRACT

A thermosetting oligomer or thermosetting polymer is provided. The thermosetting oligomer or thermosetting polymer contains repeating units, each of which has at least one thermosetting functional group in the side chain and is represented by Formula 1:

$$\left[ X_1 - A_1 - Y_1 \right] \quad (1)$$
$$\left( \begin{array}{c} | \\ L \\ | \\ (Z) \end{array} \right)_n$$

where repeating units include $X_1$, $A_1$, and $Y_1$ subunits, sidechain units include linking unit L and thermosetting functional group Z, and n is an integer from 1 to 4. The thermosetting oligomer or thermosetting polymer has a low coefficient of thermal expansion and high or no glass transition temperature, stiffness, processability, heat resistance and mechanical properties. The thermosetting oligomer or thermosetting polymer is highly soluble, wettable and dimensionally stable and is suitable for use in films, prepregs and printed circuit boards. Further provided are a thermosetting resin composition including the thermosetting oligomer or thermosetting polymer and a printed circuit board using the composition.

20 Claims, 3 Drawing Sheets

THERMOSETTING OLIGOMER OR POLYMER, THERMOSETTING RESIN COMPOSITION INCLUDING THE OLIGOMER OR POLYMER, AND PRINTED CIRCUIT BOARD USING THE COMPOSITION

CROSS-REFERENCE TO RELATED APPLICATION

This application claims priority to Korean Patent Application No. 10-2008-132150, filed on Dec. 23, 2008, and all the benefits accruing there from under 35 U.S.C. §119, the contents of which are incorporated herein by reference in its entirety.

BACKGROUND

1. Field

The present disclosure is directed to a thermosetting oligomer or thermosetting polymer, a thermosetting resin composition including the thermosetting oligomer or thermosetting polymer, and a printed circuit board using the composition. More specifically, the thermosetting oligomer or thermosetting polymer has a low coefficient of thermal expansion and either a high or no glass transition temperature due to its thermal curability to achieve improved heat resistance, mechanical properties and dimensional stability.

2. Description of the Related Art

Recent advances in information and communication technologies have transformed our society into a high-tech communication and information society based on the convergence of computers and communication devices. The trend toward miniaturization and high performance of electronic devices, including mobile phones and personal computers, has led to high-density integration of printed circuit boards as essential elements of electronic devices. Such high-density integration is achieved by various methods, for example, by stacking printed circuit boards, reducing the thickness of printed circuit boards, and reducing the diameter and interval of through-holes. Accordingly, there is a need for novel printed circuit board materials with higher performance.

The use of high operating frequencies for rapid processing of data in electronic information devices such as computers involves problems of transmission loss and signal delay. In an effort to solve such problems, it is necessary to make use of copper clad laminates with a low dielectric constant and a low dielectric loss tangent. Generally, signal delay in a printed circuit board increases linearly with the square root of the relative permittivity of the insulating material surrounding interconnect lines. Thus, low dielectric constant resin compositions are needed to produce printed wiring boards that require high transmission rates.

Bismaleimide triazine ("BT") resins and epoxy-based flame retardant 4 ("FR-4") copper clad laminates that are currently in use as board materials suffer from the problems of severe transmission loss and signal delay because of their relatively high permittivity (ca. 4.5-5.5). Further, the board materials fail to provide other satisfactory properties, for example, comparable or improved mechanical properties, high heat resistance, low thermal expansion and low moisture absorption properties, which are required for effective subsequent packaging. Thus, there is a need for novel materials that meet the requirements for next-generation boards.

In this connection, research has recently been conducted on techniques associated with the use of liquid crystal polymer ("LCP") resins. Thermoplastic liquid crystal polymers have attracted particular attention as potential replacements for polyimide ("PI"), which is currently used as a material for flexible copper clad laminates of flexible boards and rigid-flexible boards. The reason for this is that high moisture absorption, dimensional instability, high permittivity and high dielectric loss of polyimide can be solved by the use of thermoplastic liquid crystal polymers. Further, liquid crystal polymer resins have excellent electrical properties such as low permittivity and dielectric loss even at high frequencies (i.e., 1 gigahertz ("GHz") or greater).

Liquid crystal polymers are may be used as materials for flexible and rigid-flexible boards and interlayer insulating materials, based on their excellent electrical properties (for example, very low permittivity and dielectric loss) and low coefficient of thermal expansion ("CTE").

However, liquid crystal polymers, when used alone, exhibit low stiffness and insufficient heat resistance, making it difficult to use liquid crystal polymer in a semiconductor printed circuit board. For example, poor processability of meltable liquid crystal polymers can be problematic during production of a prepreg (i.e., a printed circuit board without laminated copper) for a printed circuit board or for lamination of copper foil on the prepreg. Soluble liquid crystal polymers have low glass transition temperatures ($T_g$), are processed at a high temperature, and are highly viscous because of solid components therein, which are disadvantageous in terms of impregnation efficiency. In addition, poor wettability of the soluble liquid crystal polymers on the surface of a copper foil makes it difficult to achieve high adhesive strength.

SUMMARY

In an embodiment, a thermosetting oligomer or thermosetting polymer contains repeating units, each of which has at least one thermosetting functional group in the side chain and is represented by Formula 1:

(1)

wherein $A_1$ is selected from the group consisting of a substituted or unsubstituted $C_1$-$C_{20}$ alkylene group, a substituted or unsubstituted $C_2$-$C_{20}$ alkenylene group, a substituted or unsubstituted $C_2$-$C_{20}$ alkynylene group, a substituted or unsubstituted $C_3$-$C_{20}$ cycloalkylene group, a substituted or unsubstituted $C_3$-$C_{20}$ cycloalkenylene group, a substituted or unsubstituted $C_3$-$C_{20}$ cycloalkynylene group, a substituted or unsubstituted $C_6$-$C_{30}$ arylene group, a substituted or unsubstituted $C_3$-$C_{30}$ heteroarylene group, a substituted or unsubstituted $C_3$-$C_{20}$ heterocycloalkylene group, a substituted or unsubstituted $C_3$-$C_{20}$ heterocycloalkenylene group, a substituted or unsubstituted $C_3$-$C_{20}$ heterocycloalkynylene group, and any combination thereof, $X_1$ and $Y_1$ are each independently selected from the group consisting of —C(O)O—, —O—, —C(O)NR'— (in which R' is selected from the group consisting of a hydrogen atom, a substituted or unsubstituted $C_1$-$C_{20}$ alkyl group, a substituted or unsubstituted $C_6$-$C_{30}$ aryl group, and any combination thereof), —NR"— (in which R" is selected from the group consisting of a hydrogen atom, a substituted or unsubstituted $C_1$-$C_{20}$ alkyl group, and a substituted or unsubstituted $C_6$-$C_{30}$ aryl group), —C(O)—, and any combination thereof, L represents a single bond or is a linking group selected from the group consisting of a substituted or unsubstituted $C_1$-$C_{20}$ alkylene group, a substituted or unsubstituted $C_1$-$C_{20}$ alkoxylene group, a substituted or unsubstituted $C_6$-$C_{30}$ arylene group, a substituted or unsubstituted $C_6$-$C_{30}$ oxyarylene group, —O—, —C(O)O—, and —C(O)NR'''— (in which R''' is selected from the group consisting of a hydrogen atom, a substituted or unsubstituted $C_1$-$C_{20}$ alkyl group, a substituted or unsubstituted $C_6$-$C_{30}$ aryl group, a substituted or unsubstituted $C_6$-$C_{30}$ aryloxy group, and any combination thereof), and any combination thereof, Z is a thermosetting functional group selected from the group consisting of a substituted or unsubstituted alicyclic group containing at least one double bond, triple bond, or combination of double bond and triple bond, a substituted or unsubstituted aryl group containing at least one double bond or triple bond, an isocyanate group, derivatives thereof, and any combination thereof, and n is an integer from 1 to 4.

Also disclosed herein is a thermosetting resin composition including the thermosetting oligomer or thermosetting polymer.

Also disclosed herein is a film or prepreg produced using the thermosetting oligomer or thermosetting polymer.

Also disclosed herein is a printed circuit board produced using the thermosetting oligomer or thermosetting polymer.

BRIEF DESCRIPTION OF THE DRAWINGS

The exemplary embodiments will be more clearly understood from the following detailed description taken in conjunction with the accompanying drawings, where.

DETAILED DESCRIPTION

Figure 1:
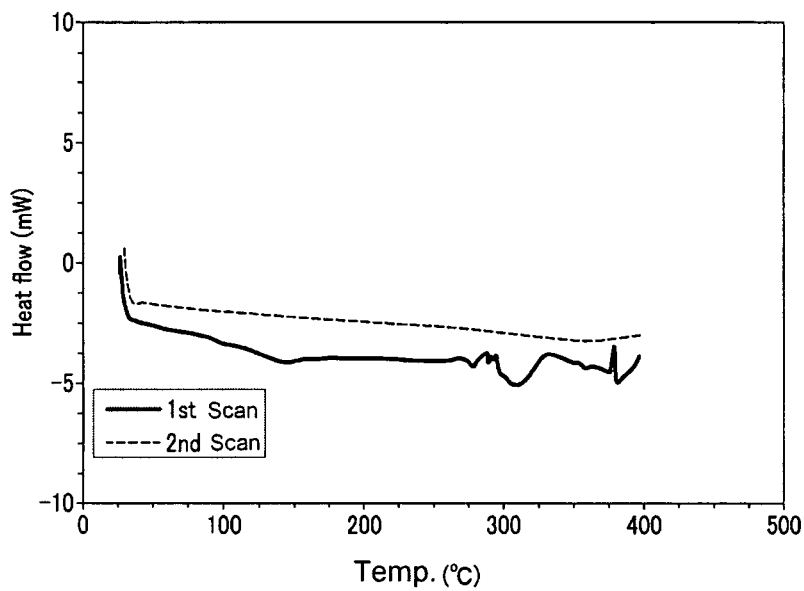
FIG. 1 shows differential scanning calorimetry ("DSC") curves of heat flow versus temperature for an exemplary polymer as prepared in Example 3.

Embodiments will now be described in greater detail hereinafter with reference to the accompanying drawings, in which embodiments of the invention are shown. These embodiments may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on, the other element or intervening elements may be present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The term "substituted" as used herein, unless otherwise specified, means that the groups are substituted with one or more groups selected from the group consisting of halo, $C_1$-$C_{20}$ alkyl, $C_1$-$C_{20}$ alkoxy, $C_6$-$C_{30}$ aryl, $C_6$-$C_{30}$ aryloxy, and any combination of these groups.

Unless otherwise specified, the groups "alkyl", "alkenyl", "alkynyl", "alkylene", "alkenylene", "alkynylene", "cycloalkylene", "cycloalkenylene", "cycloalkynylene", "alkoxy", "alkoxylene", "aryl", "arylene", "aryloxy" and "oxyarylene" as used herein represent $C_1$-$C_{20}$ alkyl, $C_2$-$C_{20}$ alkenyl, $C_2$-$C_{20}$ alkynyl, $C_1$-$C_{20}$ alkylene, $C_2$-$C_{20}$ alkenylene, $C_2$-$C_{20}$ alkynylene, $C_3$-$C_{20}$ cycloalkylene, $C_3$-$C_{20}$ cycloalkenylene, $C_3$-$C_{20}$ cycloalkynylene, $C_1$-$C_{20}$ alkoxy, $C_1$-$C_{20}$ alkoxylene, $C_6$-$C_{30}$ aryl, $C_6$-$C_{30}$ arylene, $C_6$-$C_{30}$ aryloxy and $C_6$-$C_{30}$ oxyarylene, respectively.

Unless otherwise specified, the groups "heteroarylene" and "oxyheteroarylene" as used herein refer to arylene and oxyarylene groups in which at least one of CH moieties present in the arylene ring is replaced by a heteroatom selected from the group consisting of N, O, S, P, and any combination thereof. The groups "heterocycloalkylene", "heterocycloalkenylene" and "heterocycloalkynylene" refer to cycloalkylene, cycloalkenylene and cycloalkynylene groups in which at least one of $CH_2$, CH and C moieties present in the cycloalkylene, cycloalkenylene and cycloalkynylene rings is replaced by a heteroatom selected from the group consisting of N, O, S, P, and any combination thereof.

According to an embodiment, a thermosetting oligomer or thermosetting polymer contains repeating units of Formula 1:

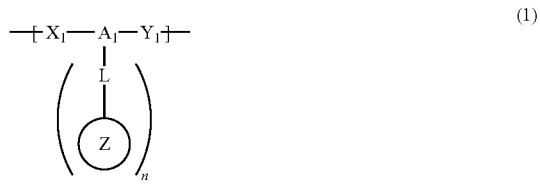

with repeating units include $X_1$, $A_1$, and $Y_1$ subunits, and sidechain units having a linking unit L and functional group Z, wherein $A_1$ is selected from the group consisting of a substituted or unsubstituted $C_1$-$C_{20}$ alkylene group, a substituted or unsubstituted $C_2$-$C_{20}$ alkenylene group, a substituted or unsubstituted $C_2$-$C_{20}$ alkynylene group, a substituted or unsubstituted $C_3$-$C_{20}$ cycloalkylene group, a substituted or unsubstituted $C_3$-$C_{20}$ cycloalkenylene group, a substituted or unsubstituted $C_3$-$C_{20}$ cycloalkynylene group, a substituted or unsubstituted $C_6$-$C_{30}$ arylene group, a substituted or unsubstituted $C_3$-$C_{30}$ heteroarylene group, a substituted or unsubstituted $C_3$-$C_{20}$ heterocycloalkylene group, a substituted or unsubstituted $C_3$-$C_{20}$ heterocycloalkenylene group, a substituted or unsubstituted $C_3$-$C_{20}$ heterocycloalkynylene group, and any combination thereof, $X_1$ and $Y_1$ are each independently selected from the group consisting of —C(O)O—, —O—, —C(O)NR'— (in which R' is selected from the group consisting of a hydrogen atom, a substituted or unsubstituted $C_1$-$C_{20}$ alkyl group, a substituted or unsubstituted $C_6$-$C_{30}$ aryl group, and any combination thereof), —NR"— (in which R" is selected from the group consisting of a hydrogen atom, a substituted or unsubstituted $C_1$-$C_{20}$ alkyl group, a substituted or unsubstituted $C_6$-$C_{30}$ aryl group, and any combination thereof), —C(O)—, and any combination thereof, L represents a single bond or is a linking group selected from the group consisting of a substituted or unsubstituted $C_1$-$C_{20}$ alkylene group, a substituted or unsubstituted $C_1$-$C_{20}$ alkoxylene group, a substituted or unsubstituted $C_6$-$C_{30}$ arylene group, a substituted or unsubstituted $C_6$-$C_{30}$ oxyarylene group, —O—, —C(O)O—, —C(O)NR'"— (in which R'" is selected from the group consisting of a hydrogen atom, a substituted or unsubstituted $C_1$-$C_{20}$ alkyl group, a substituted or unsubstituted $C_6$-$C_{30}$ aryl group, a substituted or unsubstituted $C_6$-$C_{30}$ aryloxy group, and any combination thereof), and any combination thereof, Z is a thermosetting functional group selected from the group consisting of a substituted or unsubstituted alicyclic group containing at least one double bond, triple bond, or combination of double bond and triple bond, a substituted or unsubstituted aryl group containing at least one double bond, triple bond, or combination of double bond and triple bond, an isocyanate group, derivatives thereof, and any combination thereof, and n is an integer from 1 to 4.

As described above, each of the repeating units of the thermosetting oligomer or thermosetting polymer has a structure in which at least one thermosetting functional group is present in the side chain. Due to this structure, the thermosetting functional groups of the repeating units are crosslinked when the thermosetting oligomer or thermosetting polymer undergoes thermal curing to form a rigid and stable network structure between the thermosetting oligomer or thermosetting polymer chains. As a result of the crosslinking, the thermosetting oligomer or thermosetting polymer has a very low coefficient of thermal expansion (i.e., less than about 15 ppm/° C., specifically less than about 10 ppm/° C., more specifically less than about 8 ppm/° C.) and a high (i.e., greater than about 150° C., specifically greater than about 200° C., more specifically greater than about 250° C.) or no glass transition temperature. Based on these thermal properties, the thermosetting oligomer or thermosetting polymer can be used for the production of a printed circuit board with improved mechanical properties and excellent electrical properties such as reduced signal delay.

Specifically, "alkyl" as used herein means methyl, ethyl, propyl, isopropyl, butyl, isobutyl, s-butyl, t-butyl, pentyl and hexyl. More specifically, alkyl may comprise methyl, ethyl, propyl, isopropyl, and t-butyl which are $C_1$-$C_4$ alkyl group.

Specifically, "alkenyl" as used herein means vinyl, allyl, isopropenyl, 2-methylallyl, 1-propenyl, 2-methyl-1-propenyl, 2-methyl-2-propenyl, 1-butenyl, 2-butenyl, 3-butenyl, 2-ethyl-1-butenyl, 2-methyl-1-butenyl, 3-methyl-2-butenyl, 1-pentenyl, 2-pentenyl, 3-pentenyl, 4-pentenyl, 4-methyl-3-pentenyl, 1-hexenyl, 2-hexenyl, 3-hexenyl, 4-hexenyl, 5-hexenyl.

Specifically, "alkynyl" as used herein means ethynyl, 1-propynyl, 2-propynyl, 1-butynyl, 2-butynyl, 3-butynyl, 1-pentynyl, 2-pentynyl, 3-pentynyl, 4-pentynyl, 1-hexynyl, 2-hexynyl, 3-hexynyl, 4-hexynyl, 5-hexynyl.

Specifically, "alkylene" as used herein means —$CH_2$—, —$(CH_2)_2$—, —$(CH_2)_3$—, —$(CH_2)_4$—, —$(CH_2)_5$—, —$(CH_2)_6$—, —$CH(CH_3)$—, —$C(CH_3)_2$—, —$CH(CH_3)CH_2$—, —$C(CH_3)_2CH_2$—, —$CH(CH_2CH_3)CH_2$—, —$CH(CH_3)_2$—, —$(CH_2)_2C(CH_3)_2$—, —$CH_2C(CH_3)_2CH_2$—, —$CH(CH_2CH_3)(CH_2)_2$—, —$(CH_2)_3C(CH_3)_2$—, —$(CH_2)_3CH(CH_3)CH_2$—.

Specifically, "alkenylene" as used herein means —CH=CH—, —$CH_2$—CH=CH—, —$C(CH_3)_2$—CH=CH—, —$CH_2$—CH=CH—$CH_2$—, —$CH_2$—$CH_2$—CH=CH—, —CH=CH—CH=CH—, —CH=CH—$CH_2$—$CH_2$—$CH_2$—.

Specifically, "alkynylene" as used herein means —C≡C—, —$CH_2$—C≡C—, —$CH_2$—C≡C—$CH_2$—$CH_2$—.

Specifically, "cycloalkyl" as used herein means cyclopropyl, cyclobutyl, cyclopentyl, cyclohexyl, cycloheptyl, cyclooctyl, cyclononyl.

Specifically, "cycloalkenyl" as used herein means 1-cyclobuten-1-yl, 1-cyclopenten-1-yl, 2-cyclopenten-1-yl, 3-cyclopenten-1-yl, 2-cyclohexen-1-yl, 3-cyclohexen-1-yl.

Specifically, "cycloalkylene" as used herein means cyclopropylene, cyclobutylene, cyclopentylene, cyclohexylene.

Specifically, "cycloalkenylene" as used herein means cyclopropenylene, cyclobutenylene, cyclopentenylene, and cyclohexenylene.

Specifically, "alkoxy" as used herein means methoxy, ethoxy, propoxy, butoxy, pentyloxy, hexyloxy.

Specifically, "alkoxylene" as used herein means ethoxylene, 2-methyl ethoxylene, propoxylene, butoxylene, pentoxylene, dodecyloxylene, hexadecyloxylene.

Specifically, "aryl" as used herein means phenyl, o-tolyl, m-tolyl, p-tolyl, xylyl, α-naphtyl, β-naphtyl.

Specifically, "arylene" as used herein means phenylene, biphenyl-diyl, terphenyl-diyl, naphthalene-diyl, anthracene-diyl, tetracene-diyl, fluorene-diyl, phenanthrene-diyl.

Specifically, "heteroarylene" as used herein means pyrizine-diyl, pyrazine-diyl, quinoline-diyl, isoquinoline-diyl, acridine-diyl, phenanthroline-diyl, furan-diyl, pyrol-diyl, thiopene-diyl, oxazol-diyl, oxadiazol-diyl, thiadiazol-diyl, triazol-diyl, benzooxazol-diyl, benzooxadiazol-diyl, benzothiadiazol-diyl, benzotriazol-diyl, benzothiopene-diyl.

Specifically, "oxyarylene" as used herein means that divalent group in which an oxygen atom is bound to one of the two binding sites of the above arylene group.

Specifically, "aryloxy" as used herein means phenoxy, 2-methylphenoxy, 4-methylphenoxy, 2,6-dimethylphenoxy, 2,4-di-tert-butylphenoxy, 2,6-di-tert-butylphenoxy, 2,6-di-tert-butyl-4-methylphenoxy, 2,6-di-tert-butyl-4-ethylphenoxy, 2,6-diphenylphenoxy, 1-naphtoxy, 2-naphtoxy, 9-phenanthrenyloxy, 1-piperonyloxy.

Specifically, "cycloaliphatic group" as used herein means norvinyl, norbornyl, adamantyl, tricyclo[2.2.1.13,5]octyl, tricyclo[5.2.1.12,6]decyl, tricyclo[4.3.1.12,5]undecyl, tetracyclo[4.4.0.12,5.17,10]dodecyl in addition to the above cycloalkyl.

In an exemplary embodiment, the thermosetting oligomer or thermosetting polymer may further contain repeating units, each of which has no thermosetting functional group in the side chain and is represented by Formula 2:

$$\text{---}X_2\text{-}A_2\text{-}Y_2\text{---} \quad (2)$$

wherein $A_2$, $X_2$ and $Y_2$ are as defined for $A_1$, $X_1$ and $Y_1$ in Formula 1, respectively.

In this embodiment, the repeating units of Formulae 1 and 2 may be arranged randomly, in blocks, or alternately.

In an exemplary embodiment, the repeating units of Formula 1 are present in an amount of 0.1 to 90 mol %, based on the total number of moles of the repeating units of Formulae 1 and 2 present in the thermosetting oligomer or thermosetting polymer. The thermosetting oligomer or thermosetting polymer may contain 5 to 50 mol % of the repeating units of Formula 1. The use of the repeating units of Formula 1 in an amount of 0.1 to 90 mol % in the thermosetting oligomer or thermosetting polymer may advantageously impart a low coefficient of thermal expansion to a prepreg, a film or a copper clad laminate, and the flexibility of a molded article can be maintained.

In an alternative embodiment, the thermosetting oligomer or thermosetting polymer containing the repeating units of Formula 1 may be mixed with an oligomer or polymer containing the repeating units of Formula 2. In this embodiment, the thermosetting oligomer or thermosetting polymer containing the repeating units of Formula 1 and the oligomer or polymer containing the repeating units of Formula 2 may be mixed in a weight ratio of 90:10 to 30:70, respectively.

In an exemplary embodiment, $A_1$ in Formula 1 and $A_2$ in Formula 2 may be independently selected from the group consisting of arylene groups represented by Formulae 3 to 5:

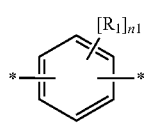

(3)

wherein $n_1$ is an integer from 0 to 4, $R_1$ is selected from the group consisting of a hydrogen atom, a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, provided that when $n_1$ is 2 or more, the substituents may be different, and at least one of CH moieties present in the aromatic ring may be replaced by a heteroatom selected from the group consisting of N, O, S, P, and any combination thereof;

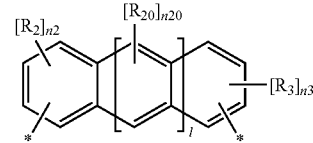

(4)

wherein $n_2$ and $n_3$ are each independently an integer from 0 to 3, $n_{20}$ is an integer from 0 to 2, $R_2$, $R_3$ and $R_{20}$ are each independently selected from the group consisting of a hydrogen atom, a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, provided that when both $n_2$ and $n_3$ are 2 or more, the respective substituents may be different, l is an integer from 0 to 3, and at least one of CH moieties present in the aromatic rings may be replaced by a heteroatom selected from the group consisting of N, O, S, P, and any combination thereof; and

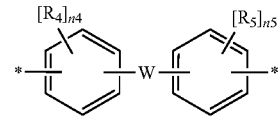

(5)

wherein $n_4$ and $n_5$ are each independently an integer from 0 to 4, $R_4$ and $R_5$ are each independently selected from the group consisting of a hydrogen atom, a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, provided that when both $n_4$ and $n_5$ are 2 or more, the respective substituents may be different, W represents a single bond or is selected from the group consisting of —O—, —S—, —C(O)—, —S(O)—, —SO$_2$—, a substituted or unsubstituted $C_1$-$C_{20}$ alkylene group, a substituted or unsubstituted $C_1$-$C_{20}$ alkoxylene group, a substituted or unsubstituted $C_1$-$C_{20}$ oxyalkoxylene group, a substituted or unsubstituted $C_6$-$C_{30}$ arylene group, a substituted or unsubstituted $C_6$-$C_{30}$ oxyarylene group, a substituted or unsubstituted $C_6$-$C_{30}$ heteroarylene group, a substituted or unsubstituted $C_6$-$C_{30}$ oxyheteroarylene group, —C(O)NR'— (in which R' is selected from the group consisting of a hydrogen atom, a substituted or unsubstituted $C_1$-$C_{20}$ alkyl group, a substituted or unsubstituted $C_6$-$C_{30}$ aryl group, a substituted or unsubstituted $C_6$-$C_{30}$ aryloxy group, and any combination thereof), a linking group represented by Formula 5a:

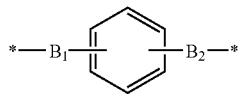
(5a)

(wherein B₁ and B₂ are each independently selected from the group consisting of —O—, —S—, —C(O)—, —S(O)—, —SO₂—, and any combination thereof), a linking group represented by Formula 5b:

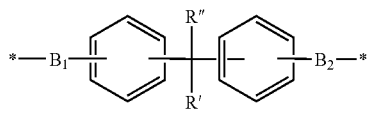
(5b)

(wherein B₁ and B₂ are each independently selected from the group consisting of —O—, —S—, —C(O)—, —S(O)—, —SO₂—, and any combination thereof, and R' and R" are each independently selected from the group consisting of a hydrogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof), a linking group represented by Formula 5c:

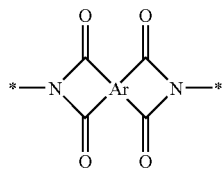
(5c)

(wherein Ar is at least one tetravalent arylene group selected from the group consisting of groups represented by Formulae 5c-1 to 5c-6, and any combination thereof:

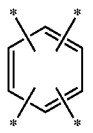
(5c-1)

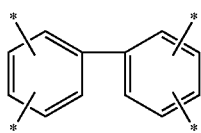
(5c-2)

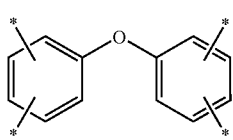
(5c-3)

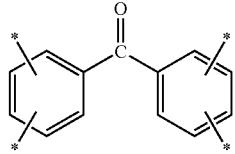
(5c-4)

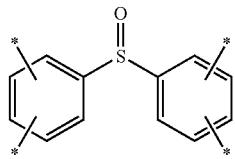
(5c-5)

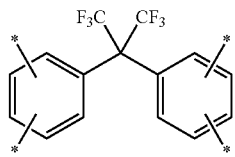
(5c-6)

and any combination thereof), and at least one of CH moieties present in the aromatic rings may be replaced by a heteroatom selected from the group consisting of N, O, S, P, and any combination thereof.

A₁ in Formula 1 and A₂ in Formula 2 may be independently selected from the group consisting of arylene groups represented by Formulae 6 to 15, and any combination thereof:

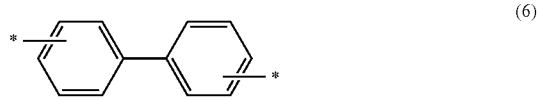
(6)

(7)

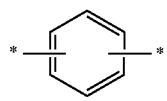
(8)

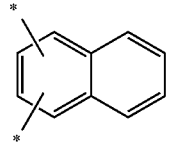
(9)

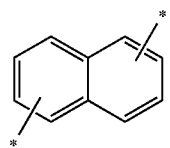
(10)

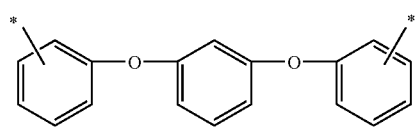
(11)

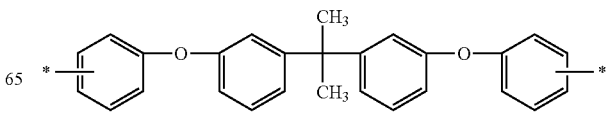

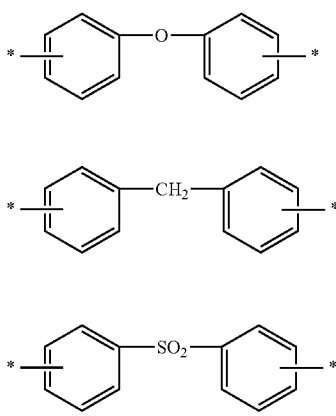 (12)

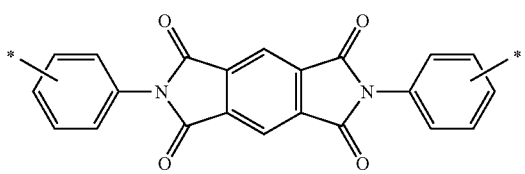 (13)

(14)

(15)

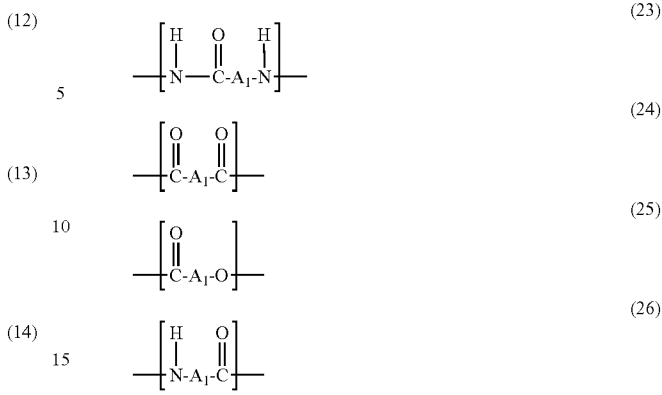

In an exemplary embodiment, each of the repeating units of Formula 1 may have a backbone selected from the group consisting of structures represented by Formulae 16 to 26, and any combination thereof:

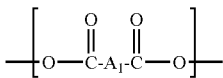 (16)

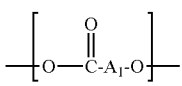 (17)

 (18)

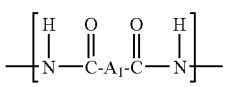 (19)

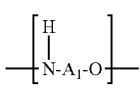 (20)

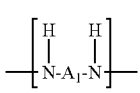 (21)

 (22)

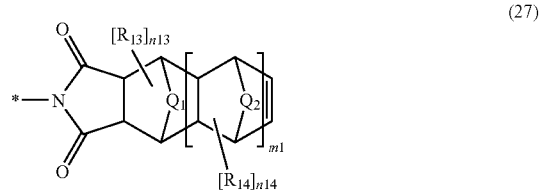

(23)

(24)

(25)

(26)

Each of the repeating units of Formula 2 may have the same backbone structure as the repeating units of Formula 1 except that $A_1$ is replaced by $A_2$.

In an embodiment, Z in Formula 1 may be selected from the group consisting of thermosetting functional groups represented by Formulae 27 to 33:

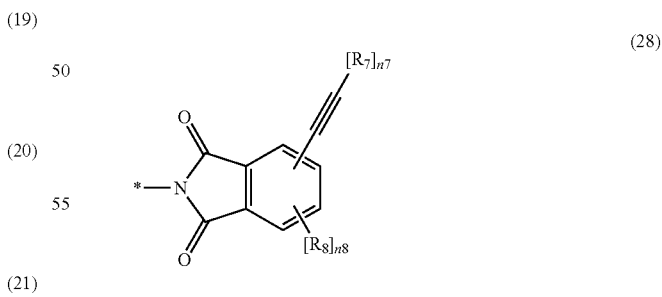

(27)

wherein $n_{13}$ and $n_{14}$ are each independently from 0 to 6, $R_{13}$ and $R_{14}$ are each independently selected from the group consisting of a hydrogen atom, a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, provided that when both $n_{13}$ and $n_{14}$ are 2 or more, the respective substituents may be different, $Q_1$ and $Q_2$ are each independently selected from the group consisting of a methylene group, —O—, —S—, and any combination thereof, and $m_1$ is from 0 to 2;

(28)

wherein $n_7$ is 1 and $n_8$ is an integer from 0 to 3, $R_7$ and $R_8$ are each independently selected from the group consisting of a hydrogen atom, a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, provided that when $n_8$ is 2 or more, the substituents may be different;

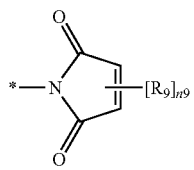
(29)

wherein $n_9$ is an integer from 0 to 2, $R_9$ is selected from the group consisting of a hydrogen atom, a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, provided that when $n_9$ is 2 or more, the substituents may be different;

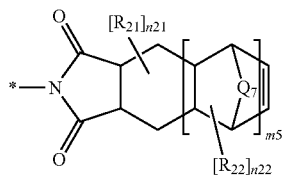
(30)

wherein $n_{21}$ is from 0 to 8, $n_{22}$ is from 0 to 6, $R_{21}$ and $R_{22}$ are each independently selected from the group consisting of a hydrogen atom, a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, provided that when both $n_{21}$ and $n_{22}$ are 2 or more, the respective substituents may be different, $Q_7$ is selected from the group consisting of a methylene group, —O—, S—, and any combination thereof, and $m_5$ is from 0 to 2;

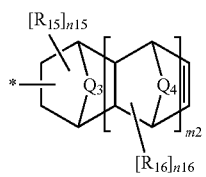
(31)

wherein $n_{15}$ is from 0 to 7, $n_{16}$ is from 0 to 6, $R_{15}$ and $R_{16}$ are each independently selected from the group consisting of a hydrogen atom, a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, provided that when both $n_{15}$ and $n_{16}$ are 2 or more, the respective substituents may be different, $Q_3$ and $Q_4$ are each independently selected from the group consisting of a methylene group, —O—, —S—, and any combination thereof, and $m_2$ is from 0 to 2;

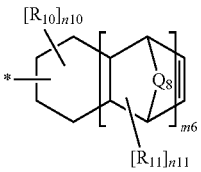
(32)

wherein $n_{10}$ is from 0 to 9, $n_{11}$ is from 0 to 6, $R_{10}$ and $R_{11}$ are each independently selected from the group consisting of a hydrogen atom, a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, provided that when both $n_{10}$ and $n_{11}$ are 2 or more, the respective substituents may be different, $Q_8$ is selected from the group consisting of a methylene group, —O—, S—, and any combination thereof, and $m_6$ is from 0 to 2; and

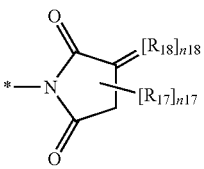
(33)

wherein $n_{17}$ is 0 or 1, $n_{18}$ is 2, $R_{17}$ is selected from the group consisting of a hydrogen atom, a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, and the groups $R_{18}$, which may be the same or different, independently represent a substituted or unsubstituted $C_1$-$C_{20}$ alkyl group.

Z in Formula 1 may be selected from the group consisting of acetylene, propargyl ether, benzocyclobutene, isocyanates, derivatives thereof, and any combination thereof.

In an embodiment, the thermosetting oligomer or thermosetting polymer may have a thermosetting functional group disposed on at least one end thereof.

The thermosetting functional group is selected from the group consisting of a substituted or unsubstituted alicyclic group containing at least one double bond, triple bond, or combination of double bond and triple bond, a substituted or unsubstituted aryl group containing at least one double bond, triple bond, or combination of double bond and triple bond, an isocyanate group, derivatives thereof, and any combination thereof. The thermosetting functional group may be one of the thermosetting functional groups represented by Formulae 27 to 33 in the repeating units of Formula 1. Another example of the thermosetting functional group may be selected from the group consisting of acetylene, propargyl ether, benzocyclobutene, isocyanates, derivatives thereof, and any combination thereof.

In an embodiment, the thermosetting oligomer or thermosetting polymer may have a number average molecular weight (Mn) of 300 to 300,000 g/mol. At these molecular weights, the thermosetting oligomer or thermosetting polymer both has an optimum crosslinking density and is highly soluble in solvents. These advantages allow the thermosetting oligomer or thermosetting polymer to have a solids content high enough to be impregnated into a net-like support, using any known impregnation methods, to produce a prepreg, thus ensuring excellent physical properties of the prepreg. The number average molecular weight of the thermosetting oligomer or thermosetting polymer may be in the range of 500 to 200,000 g/mol.

The thermosetting oligomer or thermosetting polymer may be prepared by any known polymerization processes such as melt polymerization and solution polymerization.

For example, the thermosetting oligomer or thermosetting polymer may be prepared by melt polymerization. In an exemplary melt polymerization process, a monomer having a thermosetting group capable of providing the repeating units of Formula 1 is prepared. The monomer is represented by Formula 34:

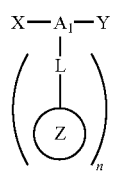

(34)

wherein $A_1$, L, Z and n are the same as $A_1$, L, Z and n defined in Formula 1, respectively, and X and Y are reactive groups from which $X_1$ and $Y_1$ in Formula 1 are derived, respectively.

The monomer is then homopolymerized or polycondensed, with at least one monomer having no thermosetting group, under heating, to prepare the thermosetting oligomer or thermosetting polymer. The monomer having no thermosetting group is selected from the group consisting of an aromatic, heterocyclic, or aliphatic dicarboxylic acid monomer, a diol monomer, a diamine monomer, an amine monomer having at least one hydroxyl group, and a carboxylic acid monomer having at least one hydroxyl group, and any mixture thereof.

The thermosetting oligomer or thermosetting polymer may also be prepared by solution polymerization. In an exemplary solution polymerization process, the monomer of Formula 34 is polymerized by a general transamidation or transesterification process in the absence or presence of a base catalyst in a solvent to prepare the thermosetting oligomer or thermosetting polymer. Alternatively, a monomer is prepared by replacing all —COOH groups present in the monomer by —C(O)Cl groups, and is then polymerized with a diamine compound in a solvent to prepare the thermosetting oligomer or thermosetting polymer.

In another embodiment, a thermosetting resin composition includes the thermosetting oligomer or thermosetting polymer.

In an embodiment, the thermosetting resin composition may further include a polar aprotic solvent. The polar aprotic solvent useful for the production of a film, a prepreg, and a printed circuit board.

The aprotic solvent may be selected from the group consisting of, but not necessarily limited to: halogenated solvents, such as 1-chlorobutane, chlorobenzene, 1,1-dichloroethane, 1,2-dichloroethane, chloroform and 1,1,2,2-tetrachloroethane; ether-based solvents, such as diethyl ether, tetrahydrofuran and 1,4-dioxane; ketone-based solvents, such as methyl ethyl ketone ("MEK"), acetone and cyclohexanone; acetate-based solvents, such as propylene glycol monomethyl ether acetate ("PGMEA"); ester-based solvents, such as ethyl acetate; lactone-based solvents, such as γ-butyrolactone; carbonate-based solvents, such as ethylene carbonate and propylene carbonate; amine-based solvents, such as triethylamine and pyridine; nitrile-based solvents, such as acetonitrile; amide-based solvents, such as N,N'-dimethylformamide ("DMF"), N,N'-dimethylacetamide ("DMAc"), tetramethylurea and N-methylpyrrolidone ("NMP"); nitro solvents, such as nitromethane and nitrobenzene; sulfoxide solvents, such as dimethylsulfoxide ("DMSO") and sulfolane; phosphate-based solvents, such as hexamethylphosphoramide and tri-n-butyl phosphoric acid; and combinations thereof.

In an exemplary embodiment, the aprotic solvent may be selected from the group consisting of N-methylpyrrolidone (NMP), dimethylsulfoxide (DMSO), N,N'-dimethylformamide (DMF), N,N'-diethylformamide, N,N'-dimethylacetamide (DMAc), N,N'-diethylacetamide, N-methylpropionamide, N-methylcaprolactam, γ-butyrolactone, dimethylimidazolidinone, tetramethylphosphoramide, ethyl cellosolve acetate, methyl ethyl ketone (MEK), propylene glycol monomethyl ether acetate (PGMEA), and combinations thereof.

The aprotic solvent may have a boiling point of 120 to 250° C.

In an embodiment, the thermosetting oligomer or thermosetting polymer may be present in an amount of 0.1 to 300 parts by weight, based on 100 parts by weight of the solvent.

In any embodiment, the thermosetting resin composition may further include at least one material selected from the group consisting of polymers other than the thermosetting polymer of Formula 1, metal oxides, fillers, and any combination thereof, if necessary, in order to provide a low coefficient of thermal expansion, reduced moisture absorption and a high mechanical strength.

As the polymers other than the thermosetting polymer of Formula 1, there may be used: polypropylene, polyamide, polyester, polyphenylenesulfide, polyetherketone, polycarbonate, polyethersulfone, polyphenylether, their mixed copolymers; thermoplastic resins, such as polyetherimde; and any combination thereof. Elastomers of copolymers, such as polyethylene-glycidyl(meth)acrylate, may also be used.

The fillers may be selected from the group consisting of: organic fillers, such as epoxy resin powder, melamine resin powder, urea resin powder, benzoguanamine resin powder, styrene resin powder, carbon, graphite; inorganic fillers, such as silica, alumina, titanium oxide, zirconia, kaolin, calcium carbonate and calcium phosphate; and combinations thereof.

In an embodiment, the thermosetting resin composition may further include a maleimide crosslinking agent. The maleimide crosslinking agent may be, in an exemplary embodiment, bismaleimide.

The thermosetting resin composition may further include one or more additives selected from the group consisting of coupling agents, anti-settling agents, UV absorbers, heat stabilizers, light stabilizers, antioxidants, and any combination thereof.

In another embodiment, there is provided a film or prepreg produced with the thermosetting resin composition. Here, "producing" includes curing the thermosetting resin composition, to provide the cure product, in which the thermosetting oligomer or thermosetting polymer form crosslinks.

In an embodiment, an article includes the cure product of the thermosetting resin composition. The article may be a film, prepreg, printed circuit board, or copper clad laminate. The article may desirably have a coefficient of thermal expansion of less than 10 ppm/° C., and a glass transition temperature of greater than 250° C.

The prepreg may be produced by impregnating a glass fiber mat with the thermosetting resin composition in the form of a solution and removing the aprotic solvent. The impregnation of the thermosetting resin composition can be carried out by any known suitable coating and impregnation technique, such as for example, by dip coating or roll coating. In an embodiment, the glass fiber mat is a woven or non-woven glass fiber mat.

In yet another embodiment, there is provided a printed circuit board produced using the thermosetting resin composition.

A copper clad laminate can be produced by applying the thermosetting resin composition to a copper foil or casting the thermosetting resin composition on a copper foil, removing the solvent, followed by annealing of the combination. The solvent may be removed by evaporation. For example, the evaporation may be carried out under reduced pressure or by flushing using a second solvent in which the first solvent is soluble. The thermosetting resin composition may be applied by various techniques, including roll coating, dip coating, spray coating, spin coating, curtain coating, slot coating and screen printing. Fine impurities contained in the thermosetting resin composition may be removed by filtration before application to or casting on the copper foil.

An aluminum foil may be used instead of the copper foil. The thickness of the metal foil may vary from 5 to 100 μm depending on the desired application of the final printed circuit board. The printed circuit board can be produced by performing circuit processing on the metal foil of the metal clad laminate. A multilayer printed circuit board can be produced by stacking the metal clad laminate on a printed laminate, followed by processing.

In an embodiment, the printed circuit board may include at least one structure selected from the group consisting of films, printed boards, copper clad laminates, prepregs, and any combination thereof.

In another embodiment, the printed circuit board may be a copper clad laminate ("CCL") and may further be a rigid CCL or a flexible CCL.

A more detailed description of exemplary embodiments will be described with reference to the following examples. However, these examples are given merely for the purpose of illustration and are not to be construed as limiting the scope of the embodiments.

EXAMPLES

Example 1

Synthesis of monomer, 5-norbornene-1,2-maleimidoisophthalic acid 38.06 g (0.23 mol) of 5-norbornene-2,3-dicarboxylic anhydride (nadic anhydride) and 400 ml of glacial acetic acid are slowly heated to 110° C. in a 1,000 ml flask. After the solid is completely dissolved, 39.48 g (0.22 mol) of 5-aminoisophthalic acid is added to the solution. The mixture is allowed to react under reflux for 2 hours. The reaction solution is cooled to room temperature. The precipitate is filtered under reduced pressure and washed with acetic acid and water. The product is dried under vacuum at 100° C., affording 69.05 g (yield=96.8%) of the monomer 5-norbornene-1,2-maleimidoisophthalic acid ("NI-IPA").

The synthetic route for the monomer is schematically depicted in Reaction 1.

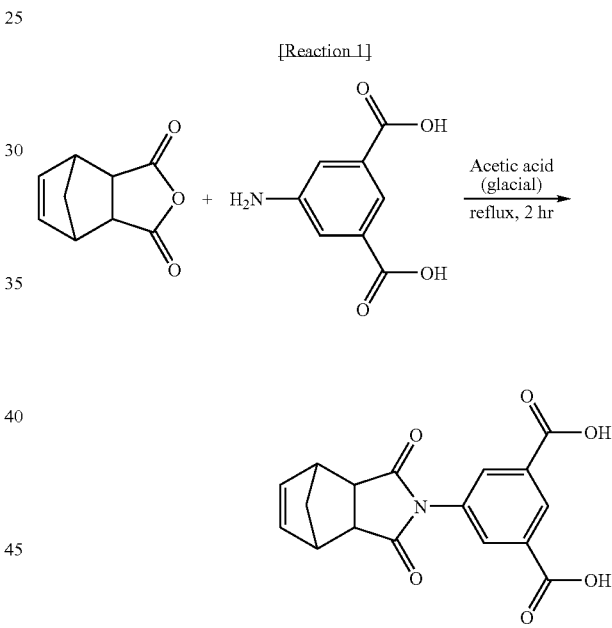

$^1$H NMR (300 MHz, DMSO-d$_6$): δ 1.62 (s, 2H, —CH$_2$—), 3.34 (m, 2H, 2×—CH—), 3.53 (m, 2H, 2×—CH—C(O)N—), 6.25 (m, 2H, 2×—C—CH=), 7.9-8.4 (m, 3H, 3×ArH).

Example 2

Synthesis of monomer, tetrahydrophthalimidoisophthalic acid 15.21 g (0.10 mol) of 1,2,3,6-tetrahydrophthalic anhydride and 160 ml of glacial acetic acid are slowly heated to 110° C. in a 500 ml flask. After the solid is completely dissolved, 18.11 g (0.10 mol) of 5-aminoisophthalic acid is added to the solution. The mixture is allowed to react under reflux for 4 hours. The reaction solution is cooled to room temperature. The precipitate is filtered under reduced pressure and washed with acetic acid and water. The product is dried under vacuum at 100° C., affording 28.73 g (yield=78.6%) of the monomer tetrahydrophthalimidoisophthalic acid (THPI-IPA).

The synthetic route for the monomer is schematically depicted in Reaction 2.

[Reaction 2]

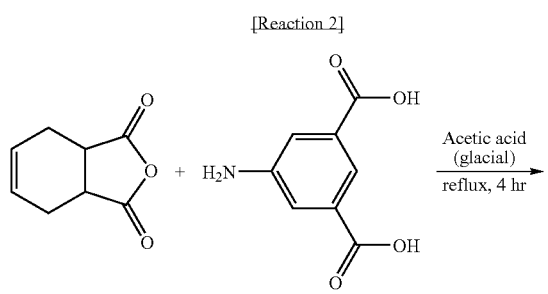

g (0.060 mol) of 4-hydroxybenzoic acid, 11.291 g (0.060 mol) of 6-hydroxy-2-naphthoic acid and 38 ml (0.396 mol) of acetic anhydride are put into a 500 ml four-neck flask equipped with a sealed mechanical stirrer, a nitrogen inlet tube, a thermometer and a reflux condenser. After the flask is sufficiently flushed with nitrogen, the internal temperature of the flask is increased to 140° C. under a stream of nitrogen. The mixture is refluxed for 3 hours while maintaining the internal temperature.

After completion of the reaction (i.e., acetylation), the reaction mixture is heated to 200° C. while distilling off acetic acid as a by-product, and unreacted acetic anhydride. The reaction mixture is heated at the same temperature for 3 hours. The polymerization is continued while slowly applying a vacuum during the last 30 minutes, yielding the polymer represented by Formula 35:

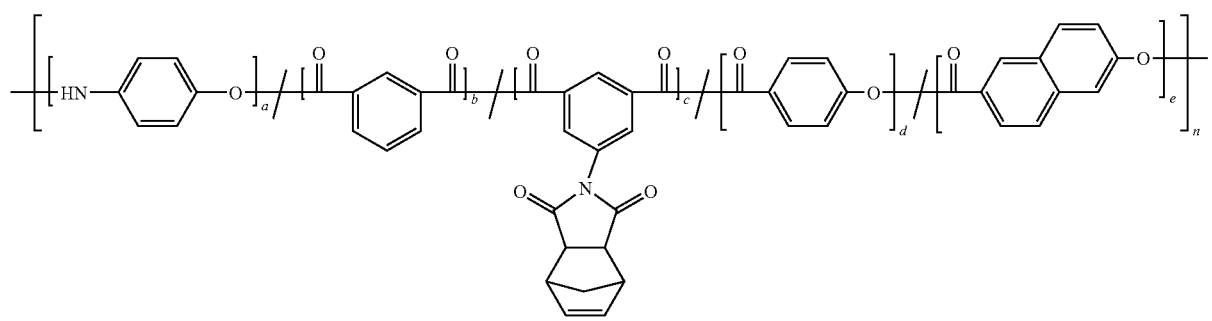

(35)

-continued

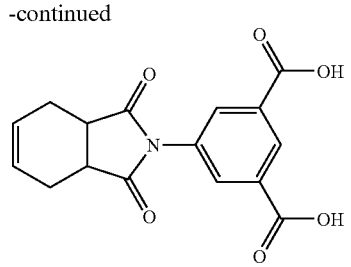

wherein the sum of mole fractions a+b+c+d+e is 1, a is 0.40, b and c are all 0.10, d and e are all 0.20, and n is a value determined by the number average molecular weight of the polymer.

The polymer is found to have a number average molecular weight ($M_n$) of 793 g/mol.

$^1$H NMR (300 MHz, DMSO-$d_6$): δ 1.90-2.45 (m, 4H, 2×—CH$_2$—C—C(O)N—), 3.31 (m, 2H, 2×—CH—C(O)N—), 5.97 (t, 2H, 2×—C—CH=), 8.03-8.47 (m, 3H, 3×ArH, 13.46 (s, 2H, 2×—CO$_2$H).

Example 3

Preparation of Polymer 13.096 g (0.120 mol) of 4-aminophenol, 4.984 g (0.030 mol) of isophthalic acid, 9.819 g (0.030 mol) of NI-IPA, 8.287

Example 4

Preparation of Polymer 163.69 g (1.5 mol) of 4-aminophenol, 327.29 g (1.0 mol) of NI-IPA, 172.65 g (1.25 mol) of 4-hydroxybenzoic acid, 235.22 g (1.25 mol) of 6-hydroxy-2-naphthoic acid and 571 ml (6.05 mol) of acetic anhydride are put into a 3 L four-neck flask.

The reactions are carried out under the same conditions as in Example 3, yielding the polymer represented by Formula 36.

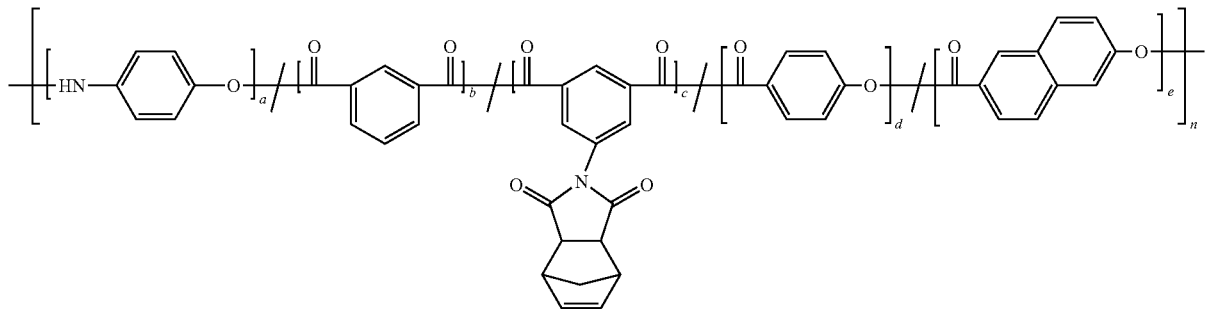

wherein the sum of mole fractions a+b+c+d+e is 1, a is 0.30, b is 0, c is 0.20, d and e are all 0.25, and n is a value determined by the number average molecular weight of the polymer.

The polymer is found to have a number average molecular weight ($M_n$) of 1,048 g/mol.

Example 5

Preparation of Polymer 32.740 g (0.3 mol) of 4-aminophenol, 63.056 g (0.2 mol) of THPI-IPA, 34.53 g (0.25 mol) of 4-hydroxybenzoic acid, 47.045 g (0.25 mol) of 6-hydroxy-2-naphthoic acid and 115 ml (1.21 mol) of acetic anhydride are put into a 500 ml four-neck flask.

The reactions are carried out under the same conditions as in Example 3, yielding the polymer represented by Formula 37.

The reactions are carried out under the same conditions as in Example 3, yielding a polymer having no thermosetting functional group. The polymer is found to have a number average molecular weight ($M_n$) of 2,517 g/mol.

Example 6

Production of Prepreg 2.0 g of the polymer of Formula 35 and 0.857 g of 4,4'-41 bismaleimidodiphenylmethane (BMI-1000, Daiwa Kasei) are added to 4.285 g of N-methylpyrrolidone (NMP) to prepare a mixed solution. After a glass fiber mat (40×40×0.05 (mm)) is placed on an electrodeposited copper foil affixed to a glass plate, the mixed solution is uniformly coated on and allowed to impregnate into the glass fiber mat and cured in a furnace while raising the temperature of the furnace from room temperature to 290° C. The cured specimen is treated with 50 parts by weight of nitric acid solution to completely

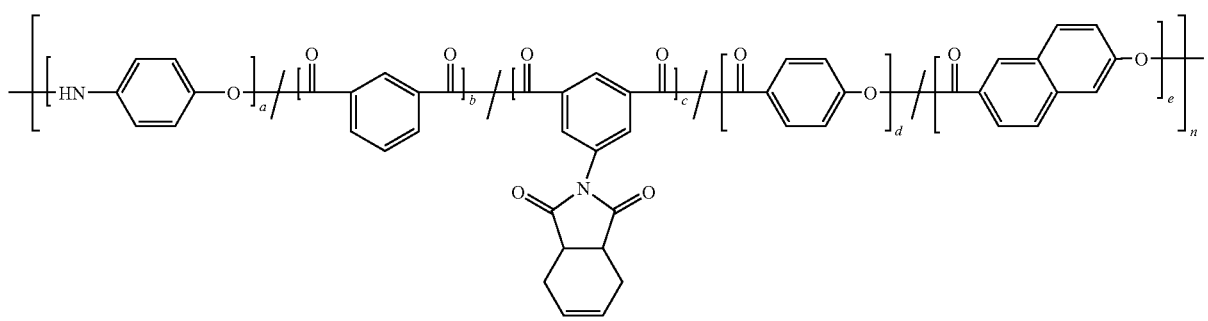

wherein the sum of mole fractions a+b+c+d+e is 1, a is 0.30, b is 0, c is 0.20, d and e are all 0.25, and n is a value determined by the number average molecular weight of the polymer.

The polymer is found to have a number average molecular weight ($M_n$) of 1,230 g/mol.

Comparative Example 1

Preparation of Polymer 16.369 g (0.15 mol) of 4-aminophenol, 24.919 g (0.15 mol) of isophthalic acid, 41.436 g (0.30 mol) of 4-hydroxybenzoic acid and 68 ml (0.72 mol) of acetic anhydride are put into a 500 ml four-neck flask.

remove the copper foil, leaving a prepreg only. The polymer is impregnated in an amount of 1.27 parts by weight, based on 1 part by weight of the glass fiber mat.

Example 7

Production of Prepreg

A prepreg is produced in the same manner as in Example 6, except that 1.5 g of the polymer of Formula 35 and 1.5 g of 4,4'-bismaleimidodiphenylmethane (BMI-1000, Daiwa Kasei) are added to 4.5 g of N-methylpyrrolidone (NMP). The polymer is impregnated in an amount of 1.14 parts by weight, based on 1 part by weight of the glass fiber mat.

Example 8

Production of Prepreg

A prepreg is produced in the same manner as in Example 6, except that 2.0 g of the polymer of Formula 36 and 2.0 g of 4,4'-bismaleimidodiphenylmethane (BMI-1000, Daiwa Kasei) are added to 4.5 g of N-methylpyrrolidone (NMP). The polymer is impregnated in an amount of 0.96 parts by weight, based on 1 part by weight of the glass fiber mat.

Example 9

Production of Prepreg

A prepreg is produced in the same manner as in Example 6, except that 1.8 g of the polymer of Formula 36 and 1.2 g of 4,4'-bismaleimidodiphenylmethane (BMI-1000, Daiwa Kasei) are added to 4.5 g of N-methylpyrrolidone (NMP). The polymer is impregnated in an amount of 1 part by weight, based on 1 part by weight of the glass fiber mat.

Example 10

Production of Prepreg

A prepreg is produced in the same manner as in Example 6, except that 1.5 g of the polymer of Formula 37 and 1.5 g of 4,4'-bismaleimidodiphenylmethane (BMI-1000, Daiwa Kasei) are added to 4.5 g of N-methylpyrrolidone (NMP). The polymer is impregnated in an amount of 1.18 parts by weight, based on 1 part by weight of the glass fiber mat.

Example 11

Production of Prepreg

A prepreg is produced in the same manner as in Example 6, except that 2.0 g of the polymer of Formula 37 and 0.857 g of 4,4'-bismaleimidodiphenylmethane (BMI-1000, Daiwa Kasei) are added to 4.285 g of N-methylpyrrolidone (NMP). The polymer is impregnated in an amount of 1.31 parts by weight, based on 1 part by weight of the glass fiber mat.

Example 12

Production of Film 1.5 g of the polymer of Formula 35 and 1.5 g of 4,4'-bismaleimidodiphenylmethane (BMI-1000, Daiwa Kasei) are added to 4.5 g of N-methylpyrrolidone (NMP). The mixed solution is coated on a glass plate (10×10 (cm$^2$)), heated at 150° C. for one hour, and dried in a vacuum oven at the same temperature for 24 hours to form a film. The film is peeled from the glass plate.

Comparative Example 2

Production of Prepreg

A prepreg is produced in the same manner as in Example 6, except that 1.5 g of the polymer prepared in Comparative Example 1 and 1.5 g of 4,4'-bismaleimidodiphenylmethane (BMI-1000, Daiwa Kasei) are added to 4.5 g of N-methylpyrrolidone (NMP). The polymer is impregnated in an amount of 0.92 parts by weight, based on 1 part by weight of the glass fiber mat.

Comparative Example 3

Production of Prepreg

A prepreg is produced in the same manner as in Example 6, except that 2.0 g of the polymer prepared in Comparative Example 1 and 0.857 g of 4,4'-bismaleimidodiphenylmethane (BMI-1000, Daiwa Kasei) are added to 4.285 g of N-methylpyrrolidone (NMP). The polymer is impregnated in an amount of 0.91 parts by weight, based on 1 part by weight of the glass fiber mat.

Evaluation of Thermal Properties of the Polymers

Figure 2:
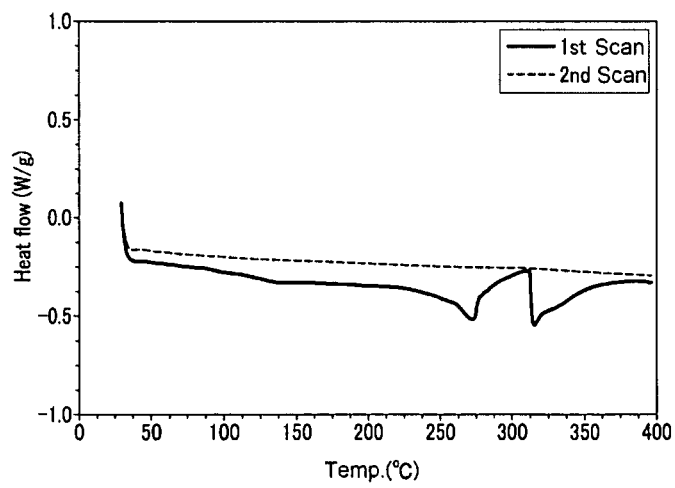
FIG. 2 shows DSC curves of heat flow versus temperature for an exemplary polymer prepared in Example 4.
Figure 3:
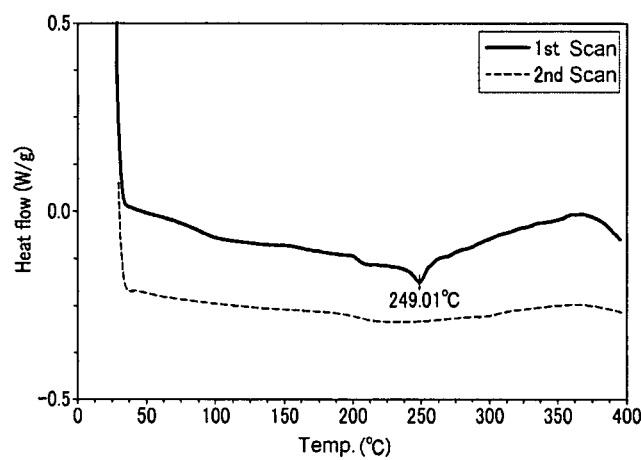
FIG. 3 shows differential scanning calorimetry (DSC) curves of heat flow versus temperature for a comparative polymer prepared in Comparative Example 1.

The thermal properties of the polymers prepared in Examples 3 and 4 and Comparative Example 1 are analyzed using a differential scanning calorimeter (DSC 2010, TA Instruments), and the obtained results are shown in FIGS. 1, 2 and 3, respectively.

FIG. 1 shows differential scanning calorimetry (DSC) curves of heat flow (in mW) versus temperature (° C.) for the polymer prepared in Example 3.

The first heating curve in FIG. 1 shows that glass transition, melting and curing of the polymer occur at temperatures of 145° C., >275° C. and 332° C., respectively. The second heating curve in FIG. 1 shows that the polymer undergoes no phase change.

FIG. 2 shows DSC curves of heat flow (in mW) versus temperature (° C.) for the polymer prepared in Example 4.

The first heating curve in FIG. 2 shows that glass transition, melting and curing of the polymer occur at temperatures of 135° C., >225° C. and 300° C., respectively. The second heating curve in FIG. 2 shows that the polymer undergoes no phase change.

FIG. 3 shows DSC curves of heat flow (in mW) versus temperature (° C.) for the polymer prepared in Comparative Example 1.

The first heating curve in FIG. 3 shows that glass transition and melting of the polymer, which has no thermosetting functional group, are observed at temperatures of 200° C. and >245° C., respectively. The second heating curve in FIG. 3 shows that phase change characteristics of the polymer are again found at a temperature above 200° C.

Evaluation of Thermal Properties of the Prepregs

The glass transition temperature ($T_g$) and the coefficient of thermal expansion (CTE) of the prepregs produced in Examples 6-11 and Comparative Examples 2-3 are measured using a thermomechanical analyzer (TMA 2940, TA Instruments). The results are shown in Table 1. The CTE measurements are performed under a nitrogen atmosphere while raising the temperature at a rate of 10° C./min.

TABLE 1

| | Ex. 6 | Ex. 7 | Ex. 8 | Ex. 9 | Ex. 10 | Ex. 11 | Comp. Ex. 2 | Comp. Ex. 3 |
|---|---|---|---|---|---|---|---|---|
| $T_g$ (° C.) | — | — | — | — | — | — | 249 | 230 |
| CTE (ppm/° C.) | 7.32 | 4.45 | 4.31 | 5.48 | 2.64 | 5.55 | 10.66 | 13.74 |

The results in Table 1 show that the prepregs of Examples 6-11, each of which is produced using the thermosetting oligomer or thermosetting polymer containing repeating units having thermosetting functional groups in the side chains, have very low coefficients of thermal expansion (less than 10 ppm/° C.) and no observable glass transition temperature (i.e., a Tg>250° C. as compared to the prepregs of Comparative Examples 2-3, each which is produced using the thermosetting oligomer or thermosetting polymer containing repeating units having no thermosetting functional group.

These results indicate that the prepregs of Examples 1-6 can be used for the production of printed circuit boards with excellent electrical properties, such as reduced signal delay.

Figure 4:
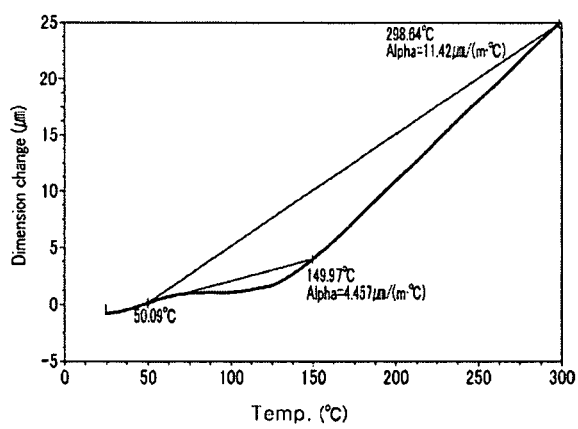
FIG. 4 is a graph of dimensional change versus temperature showing the results of thermomechanical analysis ("TMA") for an exemplary prepreg produced in Example 7.

FIG. 4 is a graph of dimensional change (in μm) versus temperature (° C.), showing the results of thermomechanical analysis (TMA) for the prepreg produced in Example 7. The graph shows that the prepreg has a coefficient of thermal expansion of 4.45 ppm/° C. at a temperature of 50-150° C.

Evaluation of Thermal Properties of the Film

Figure 5:
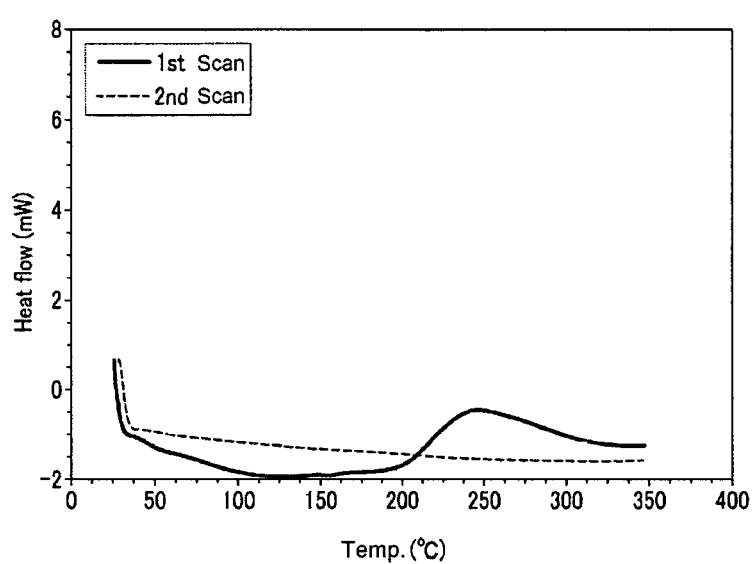
FIG. 5 shows DSC curves of heat flow versus temperature for an exemplary film produced in Example 12.

The thermal properties of the film produced in Example 12 are analyzed using a differential scanning calorimeter (DSC 2010, TA Instruments). The results are shown in FIG. 5. FIG. 5 shows DSC curves of heat flow (in mW) versus temperature (° C.) for the film. The first heating curve in FIG. 5 shows that melting and curing of the film simultaneously occur at a temperature above 200° C. The second heating curve in FIG. 5 shows that no phase change of the film is observed.

As is apparent from the foregoing, the thermosetting thermosetting oligomer or thermosetting polymer of the exemplary embodiments has a low coefficient of thermal expansion and either a high or no glass transition temperature due to its thermal curability to achieve excellent characteristics in terms of stiffness, processability, heat resistance and mechanical properties. In addition, the thermosetting oligomer or polymer is highly soluble and wettable to ensure improved shape retention and dimensional stability. Therefore, the thermosetting oligomer or polymer is suitable for use in the production of prepregs and printed circuit boards. Furthermore, the use of the thermosetting oligomer or polymer allows for the production of various printed circuit boards at low cost.

Although exemplary embodiments have been described herein with reference to the foregoing preferred embodiments, those skilled in the art will appreciate that exemplary embodiments can be implemented in other specific forms without changing the spirit or essential features of the invention. Therefore, it should be noted that the forgoing embodiments are merely illustrative in all aspects and are not to be construed as limiting the invention.

What is claimed is:

1. A thermosetting oligomer or thermosetting polymer containing a structural unit of Formula 1:

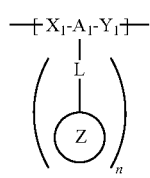

(1)

wherein
$A_1$ is selected from the group consisting of a substituted or unsubstituted $C_2$-$C_{20}$ alkenylene group, a substituted or unsubstituted $C_2$-$C_{20}$ alkynylene group, a substituted or unsubstituted $C_3$-$C_{20}$ cycloalkylene group, a substituted or unsubstituted $C_3$-$C_{20}$ cycloalkenylene group, a substituted or unsubstituted $C_3$-$C_{20}$ cycloalkynylene group, a substituted or unsubstituted $C_6$-$C_{30}$ arylene group, a substituted or unsubstituted $C_3$-$C_{30}$ heteroarylene group, a substituted or unsubstituted $C_3$-$C_{20}$ heterocycloalkylene group, a substituted or unsubstituted $C_3$-$C_{20}$ heterocycloalkenylene group, a substituted or unsubstituted $C_3$-$C_{20}$ heterocycloalkynylene group, and any combination thereof, $X_1$ and $Y_1$ are each independently selected from the group consisting of —C(O)O—; —O—; —C(O)NR'—, —NR''—, —C(O)—, and any combination thereof; wherein R' is selected from the group consisting of a hydrogen atom, a substituted or unsubstituted $C_1$-$C_{20}$ alkyl group, a substituted or unsubstituted $C_6$-$C_{30}$ aryl group, and any combination thereof and R'' is selected from the group consisting of a hydrogen atom, a substituted or unsubstituted $C_1$-$C_{20}$ alkyl group, a substituted or unsubstituted $C_6$-$C_{30}$ aryl group, and any combination thereof, L is a single bond or is a linking group selected from the group consisting of a substituted or unsubstituted $C_1$-$C_{20}$ alkylene group; a substituted or unsubstituted $C_1$-$C_{20}$ alkoxylene group; a substituted or unsubstituted $C_6$-$C_{30}$ arylene group; a substituted or unsubstituted $C_6$-$C_{30}$ oxyarylene group; —O—; —C(O)O—; —C(O)NR'''—, and any combination thereof, wherein R''' is selected from the group consisting of a hydrogen atom, a substituted or unsubstituted $C_1$-$C_{20}$ alkyl group, a substituted or unsubstituted $C_6$-$C_{30}$ aryl group, a substituted or unsubstituted $C_6$-$C_{30}$ aryloxy group, and any combination thereof, Z is selected from the group consisting of thermosetting functional groups represented by Formulae 27, 28, 30 and 32-33:

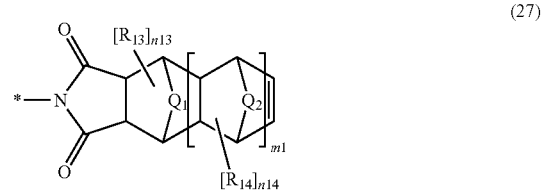

(27)

wherein
$n_{13}$ and $n_{14}$ are each independently from 0 to 6,
$R_{13}$ and $R_{14}$ are each independently selected from the group consisting of a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, $Q_1$ and $Q_2$ are each independently selected from the group consisting of a methylene group, —O—, —S—, and any combination thereof, and
$m_1$ is from 0 to 2,
provided that when either $n_{13}$ or $n_{14}$ is 2 or more, the respective substituents are the same or different;

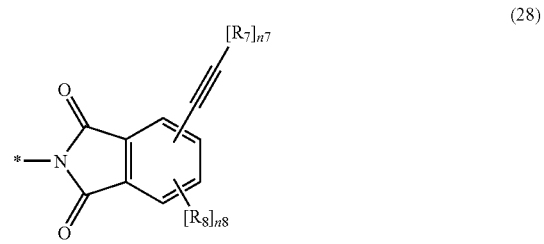

(28)

wherein $n_7$ is 1 and $n_8$ is an integer from 0 to 3, $R_7$ and $R_8$ are each independently selected from the group consisting of a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, and when $n_8$ is 2 or more, the substituents are the same or different;

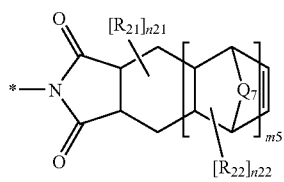

(30)

wherein $n_{21}$ is from 0 to 8, $n_{22}$ is from 0 to 6, $R_{21}$ and $R_{22}$ are each independently selected from the group consisting of a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, $Q_7$ is selected from the group consisting of a methylene group, O and S, and $m_5$ is from 0 to 2, provided that when either $n_{21}$ or $n_{22}$ is 2 or more, the respective substituents are the same or different;

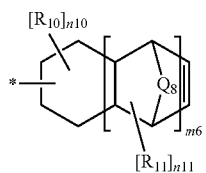

(32)

wherein $n_{10}$ is from 0 to 9, $n_{11}$ is from 0 to 6, $R_{10}$ and $R_{11}$ are each independently selected from the group consisting of a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, $Q_8$ is selected from the group consisting of a methylene group, O and S, and $m_6$ is from 0 to 2, provided that when either $n_{10}$ or $n_{11}$ is 2 or more, the respective substituents are the same or different; and

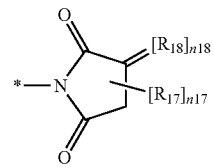

(33)

wherein $n_{17}$ is 0 or 1, $n_{18}$ is 2, $R_{17}$ is selected from the group consisting of a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, and the groups $R_{18}$, which are the same or different, independently represent a substituted or unsubstituted $C_1$-$C_{20}$ alkyl group, and n is an integer from 1 to 4, provided that when n is 2 or more, the units L-Z are the same or different.

2. The thermosetting oligomer or thermosetting polymer of claim 1, further containing a structural unit represented by Formula 2:

$$\text{-[-}X_2\text{-}A_2\text{-}Y_2\text{-]-}$$  (2)

wherein $A_2$, $X_2$ and $Y_2$ are as defined for $A_1$, $X_1$ and $Y_1$ in Formula 1, respectively.

3. The thermosetting oligomer or thermosetting polymer of claim 2, wherein the structural unit of Formula 1 is present in an amount of about 0.1 to about 90 mol %, based on the total number of moles of the structural unit of Formulae 1 and 2.

4. The thermosetting oligomer or thermosetting polymer of claim 1, wherein $A_1$ is selected from the group consisting of groups represented by Formulae 3 to 5:

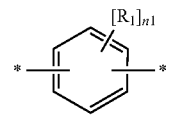

(3)

wherein $n_1$ is an integer from 0 to 3, $R_1$ is selected from the group consisting of a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, and at least one carbon atom of an aromatic moiety present in the $A_1$ group represented by Formula 3 is optionally replaced by a heteroatom selected from the group consisting of N, O, S, P, and any combination thereof, provided that when $n_1$ is 2 or more, the substituents are the same or different;

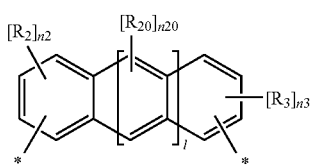
(4)

wherein $n_2$ and $n_3$ are each independently an integer from 0 to 3, $n_{20}$ is an integer from 0 to 2, n2+n3+n20 is an integer from 0 to 7, $R_2$, $R_3$ and $R_{20}$ are each independently selected from the group consisting of a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, l is an integer from 0 to 3, and at least one carbon atom of an aromatic moiety present in the $A_1$ group represented by Formula 4 is optionally replaced by a heteroatom selected from the group consisting of N, O, S, P, and any combination thereof, provided that when any one of $n_2$, $n_3$ and $n_{20}$ is 2 or more, the respective substituents are the same or different, and when l is 2 or 3, the units are the same or different; and

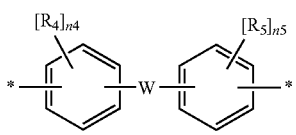
(5)

wherein $n_4$ and $n_5$ are each independently an integer from 0 to 4, n4+n5 is an integer from 0 to 7, $R_4$ and $R_5$ are each independently selected from the group consisting of a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, provided that when either $n_4$ and $n_5$ are 2 or more, the respective substituents are the same or different, W represents a single bond or is selected from the group consisting of —O—; —S—; —C(O)—; —S(O)—; —SO$_2$—; a substituted or unsubstituted $C_1$-$C_{20}$ alkoxylene group; a substituted or unsubstituted $C_1$-$C_{20}$ oxyalkoxylene group; a substituted or unsubstituted $C_6$-$C_{30}$ arylene group; a substituted or unsubstituted $C_6$-$C_{30}$ oxyarylene group; a substituted or unsubstituted $C_6$-$C_{30}$ heteroarylene group; a substituted or unsubstituted $C_6$-$C_{30}$ oxyheteroarylene group; —C(O)NR'—, wherein R' is selected from the group consisting of a hydrogen atom, a substituted or unsubstituted $C_1$-$C_{20}$ alkyl group, a substituted or unsubstituted $C_6$-$C_{30}$ aryl group, a substituted or unsubstituted $C_6$-$C_{30}$ aryloxy group, and any combination thereof; a linking group represented by Formula 5a;

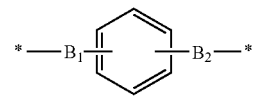
(5a)

a linking group represented by Formula 5b;

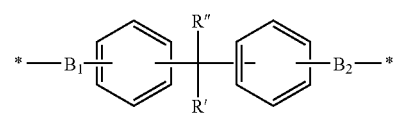
(5b)

a linking group represented by Formula 5c;

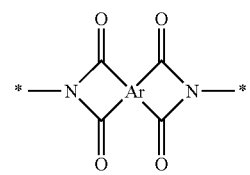
(5c)

and any combination thereof;

wherein in Formula 5a, $B_1$ and $B_2$ are each independently selected from the group consisting of —O—, —S—, —C(O)—, —S(O)—, SO$_2$—, and any combination thereof;

in Formula 5b, $B_1$ and $B_2$ are each independently selected from the group consisting of —O—, —S—, —C(O)—, —S(O)—, —SO$_2$—, and any combination thereof, and R' and R'' are each independently selected from the group consisting of a hydrogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof; and in Formula 5c, Ar is at least one tetravalent arylene group selected from the group consisting of groups represented by Formulae 5c-1 to 5c-6, and any combination thereof:

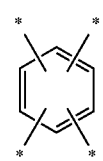
(5c-1)

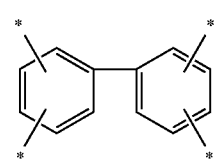
(5c-2)

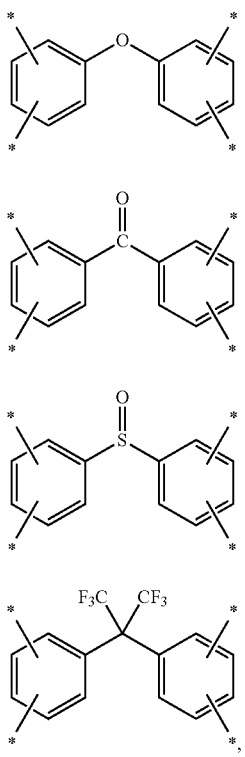

and wherein at least one of carbon atom of an aromatic moiety present in the $A_1$ group represented by Formula 5 is optionally replaced by a heteroatom selected from the group consisting of N, O, S, P, and any combination thereof, provided that the total number of carbon atoms in each of Formulae 3 to 5 does not exceed 30.

5. The thermosetting oligomer or thermosetting polymer of claim 1, wherein the structural unit of Formula 1 has a backbone selected from the group consisting of structures represented by Formulae 16 to 26, and any combination thereof:

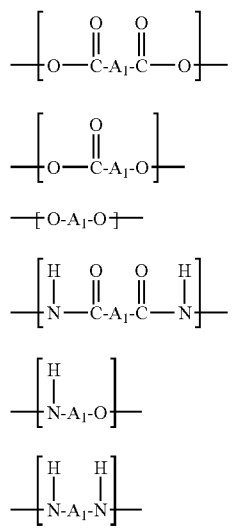

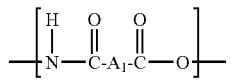

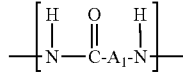

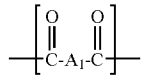

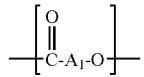

wherein $A^1$ is as defined for Formula (1).

6. The thermosetting oligomer or thermosetting polymer of claim 1, wherein the thermosetting oligomer or thermosetting polymer has a number average molecular weight of about 300 to about 300,000 g/mol.

7. A thermosetting resin composition comprising the thermosetting oligomer or thermosetting polymer of claim 1.

8. The thermosetting composition of claim 7, further comprising a polar aprotic solvent.

9. The thermosetting composition of claim 8, wherein the polar aprotic solvent is selected from the group consisting of N-methylpyrrolidone, dimethylsulfoxide, N,N'-dimethylformamide, N,N'-diethylformamide, N,N'-dimethylacetamide, N,N'-diethylacetamide, N-methylpropionamide, N-methylcaprolactam, γ-butyrolactone, dimethylimidazolidinone, tetramethylphosphoramide, ethyl cellosolve acetate, methyl ethyl ketone, propylene glycol monomethyl ether acetate, and combinations thereof.

10. The thermosetting composition of claim 8, wherein the thermosetting oligomer or thermosetting polymer is present in an amount of about 0.1 to about 300 parts by weight, based on 100 parts by weight of the solvent.

11. The thermosetting composition of claim 7, further comprising at least one material selected from the group consisting of polymers not identical to the thermosetting polymers or oligomers, metal oxides, fillers, and any combination thereof.

12. The composition of claim 7, further comprising a maleimide crosslinking agent.

13. A product produced with the composition of claim 7.

14. The product of claim 13, wherein the product comprises a prepreg, a film, or a printed circuit board.

15. The printed circuit board of claim 14, wherein the printed circuit board comprises at least one structure selected from the group consisting of films, printed boards, copper clad laminates, and prepregs.

16. The printed circuit board of claim 14, wherein the printed circuit board is a rigid copper clad laminate or a flexible copper clad laminate.

17. The thermosetting oligomer or thermosetting polymer of claim 1, further comprising an oligomer or polymer containing structural units, each of which has no thermosetting functional group in the side chain and is represented by Formula 2:

$$\pm X_2\text{-}A_2\text{-}Y_2\pm \quad (2)$$

wherein $A_2$, $X_2$ and $Y_2$ are as defined for $A_1$, $X_1$ and $Y_1$ in Formula 1, respectively.

18. The thermosetting oligomer or thermosetting polymer of claim 17, wherein the thermosetting oligomer or thermosetting polymer containing the structural unit of Formula 1, and the oligomer or polymer containing the structural unit of Formula 2, are mixed in a weight ratio of 90:10 to 30:70, respectively.

19. An article comprising the cured product of a thermosetting resin composition comprising the thermosetting oligomer or thermosetting polymer containing a structural unit of Formula 1:

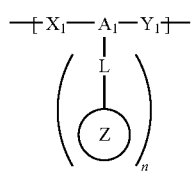

(1)

wherein $A_1$ is selected from the group consisting of a substituted or unsubstituted $C_2$-$C_{20}$ alkenylene group, a substituted or unsubstituted $C_2$-$C_{20}$ alkynylene group, a substituted or unsubstituted $C_3$-$C_{20}$ cycloalkylene group, a substituted or unsubstituted $C_3$-$C_{20}$ cycloalkenylene group, a substituted or unsubstituted $C_3$-$C_{20}$ cycloalkynylene group, a substituted or unsubstituted $C_6$-$C_{30}$ arylene group, a substituted or unsubstituted $C_3$-$C_{30}$ heteroarylene group, a substituted or unsubstituted $C_3$-$C_{20}$ heterocycloalkylene group, a substituted or unsubstituted $C_3$-$C_{20}$ heterocycloalkenylene group, a substituted or unsubstituted $C_3$-$C_{20}$ heterocycloalkynylene group, and any combination thereof, $X_1$ and $Y_1$ are each independently selected from the group consisting of —C(O)O—; —O—; —C(O)NR'—, —NR''—, —C(O)—, and any combination thereof; wherein R' is selected from the group consisting of a hydrogen atom, a substituted or unsubstituted $C_1$-$C_{20}$ alkyl group, a substituted or unsubstituted $C_6$-$C_{30}$ aryl group, and any combination thereof, and R'' is selected from the group consisting of a hydrogen atom, a substituted or unsubstituted $C_1$-$C_{20}$ alkyl group, a substituted or unsubstituted $C_6$-$C_{30}$ aryl group, and any combination thereof, L is a single bond or is a linking group selected from the group consisting of a substituted or unsubstituted $C_1$-$C_{20}$ alkylene group; a substituted or unsubstituted $C_1$-$C_{20}$ alkoxylene group; a substituted or unsubstituted $C_6$-$C_{30}$ arylene group; a substituted or unsubstituted $C_6$-$C_{30}$ oxyarylene group; —O—; —C(O)O—; —C(O)NR'''—, and any combination thereof, wherein R''' is selected from the group consisting of a hydrogen atom, a substituted or unsubstituted $C_1$-$C_{20}$ alkyl group, a substituted or unsubstituted $C_6$-$C_{30}$ aryl group, a substituted or unsubstituted $C_6$-$C_{30}$ aryloxy group, and any combination thereof, Z is selected from the group consisting of thermosetting functional groups represented by Formulae 27, 28, 30 and 32-33:

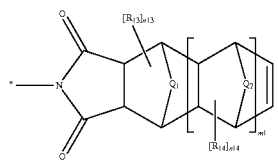

(27)

wherein
$n_{13}$ and $n_{14}$ are each independently from 0 to 6,
$R_{13}$ and $R_{14}$ are each independently selected from the group consisting of a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, $Q_1$ and $Q_2$ are each independently selected from the group consisting of a methylene group, —O—, —S—, and any combination thereof, and
$m_1$ is from 0 to 2,
provided that when either $n_{13}$ or $n_{14}$ is 2 or more, the respective substituents are the same or different;

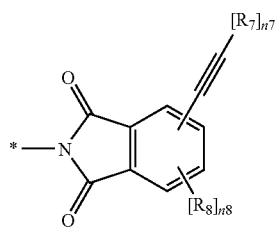

(28)

wherein
$n_7$ is 1 and $n_8$ is an integer from 0 to 3,
$R_7$ and $R_8$ are each independently selected from the group consisting of a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, and
when $n_8$ is 2 or more, the substituents are the same or different;

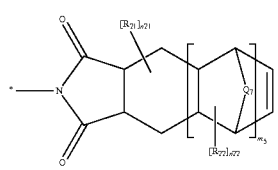

(30)

wherein
$n_{21}$ is from 0 to 8,
$n_{22}$ is from 0 to 6,
$R_{21}$ and $R_{22}$ are each independently selected from the group consisting of a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, $Q_7$ is selected from the group consisting of a methylene group, O and S, and $m_5$ is from 0 to 2, provided that when either $n_{21}$ or $n_{22}$ is 2 or more, the respective substituents are the same or different;

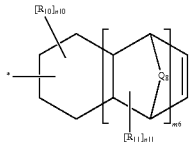
(32)

wherein $n_{10}$ is from 0 to 9, $n_{11}$ is from 0 to 6, $R_{10}$ and $R_{11}$ are each independently selected from the group consisting of a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, $Q_8$ is selected from the group consisting of a methylene group, O and S, and $m_6$ is from 0 to 2, provided that when either $n_{10}$ or $n_{11}$ is 2 or more, the respective substituents are the same or different; and

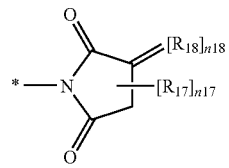
(33)

wherein $n_{17}$ is 0 or 1, $n_{18}$ is 2, $R_{17}$ is selected from the group consisting of a halogen atom, a substituted or unsubstituted $C_1$-$C_{20}$ alkyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, and any combination thereof, and the groups $R_{18}$, which are the same or different, independently represent a substituted or unsubstituted $C_1$-$C_{20}$ alkyl group, and n is an integer from 1 to 4, and wherein the article is a prepreg, printed circuit board, or copper clad laminate.

20. The article of claim 19, having a coefficient of thermal expansion of less than 8 ppm/° C., and a glass transition temperature of greater than 250° C.

* * * * *